United States Patent
Emori et al.

(10) Patent No.: US 8,791,668 B2
(45) Date of Patent: Jul. 29, 2014

(54) MULTI-SERIES BATTERY CONTROL SYSTEM

(71) Applicants: Akihiko Emori, Hitachi (JP); Shigeyuki Yoshihara, Hitachinaka (JP); Kazuyoshi Sasazawa, Hitachinaka (JP); Tatsuo Horiba, Fukaya (JP); Akihiko Kudo, Hitachinaka (JP)

(72) Inventors: Akihiko Emori, Hitachi (JP); Shigeyuki Yoshihara, Hitachinaka (JP); Kazuyoshi Sasazawa, Hitachinaka (JP); Tatsuo Horiba, Fukaya (JP); Akihiko Kudo, Hitachinaka (JP)

(73) Assignee: Shin-Kobe Electric Machinery Co., Ltd., Tokyo (JP)

( * ) Notice: Subject to any disclaimer, the term of this patent is extended or adjusted under 35 U.S.C. 154(b) by 0 days.

(21) Appl. No.: 13/724,828

(22) Filed: Dec. 21, 2012

(65) Prior Publication Data

US 2013/0113428 A1    May 9, 2013

Related U.S. Application Data

(63) Continuation of application No. 12/415,775, filed on Mar. 31, 2009, now Pat. No. 8,339,099, which is a continuation of application No. 11/117,480, filed on Apr. 29, 2005, now Pat. No. 7,511,457.

(30) Foreign Application Priority Data

Apr. 30, 2004  (JP) ................................ 2004-135022

(51) Int. Cl.
    *H02J 7/00*  (2006.01)
(52) U.S. Cl.
    USPC ........................................................ 320/118

(58) Field of Classification Search
    USPC .................................................. 320/116–118
    See application file for complete search history.

(56) References Cited

U.S. PATENT DOCUMENTS

| 5,504,415 A | 4/1996 | Podrazhansky et al. |
| 5,965,996 A | 10/1999 | Arledge et al. |
| 5,998,969 A | 12/1999 | Tsuji et al. |

(Continued)

FOREIGN PATENT DOCUMENTS

| JP | 63-314939 | 12/1988 |
| JP | 2002-25628 | 1/2002 |

(Continued)

OTHER PUBLICATIONS

Office Action in Japanese patent application JP2010-215188, mailed Jun. 19, 2012 (2 pgs, in Japanese), partial English language translation (2 pgs).

*Primary Examiner* — Samuel Berhanu
(74) *Attorney, Agent, or Firm* — Antonelli, Terry, Stout & Kraus, LLP.

(57) ABSTRACT

A multi-series battery control system comprises a plurality of unit battery cell of which unit consists of multiple battery cells connected in series; a plurality of control IC comprising a control circuit for controlling the unit battery cell; a main controller that sends and receives signal to/from the control ICs via an insulation; means for sending an abnormality signal, which represents the existence or the absence of abnormality of the control ICs or the battery cells, to the main controller from the control ICs, responding to the first signal outputted from the main controller via the insulation; and means for searching contents of the abnormality in the control ICs or the battery cells and sending the abnormality contents signal based on the search, to the main controller from the control ICs, responding to the second signal outputted from the main controller via the insulation.

5 Claims, 11 Drawing Sheets

(56) References Cited

U.S. PATENT DOCUMENTS

| | | |
|---|---|---|
| 6,252,376 B1 * | 6/2001 | Nakamura et al. ............ 320/132 |
| 6,297,618 B2 | 10/2001 | Emori et al. |
| 6,762,588 B2 | 7/2004 | Miyazaki et al. |
| 6,891,352 B2 | 5/2005 | Miyazaki et al. |
| 2003/0015995 A1 | 1/2003 | Tamura et al. |
| 2003/0044689 A1 | 3/2003 | Miyazaki et al. |
| 2005/0242667 A1 | 11/2005 | Emori et al. |
| 2007/0018613 A1 | 1/2007 | Miyazaki |

FOREIGN PATENT DOCUMENTS

| | | |
|---|---|---|
| JP | 2003-32907 | 1/2003 |
| JP | 2003-070179 | 3/2003 |
| JP | 2003-217681 | 7/2003 |
| JP | 2000-014027 | 1/2007 |

* cited by examiner

FIG. 3
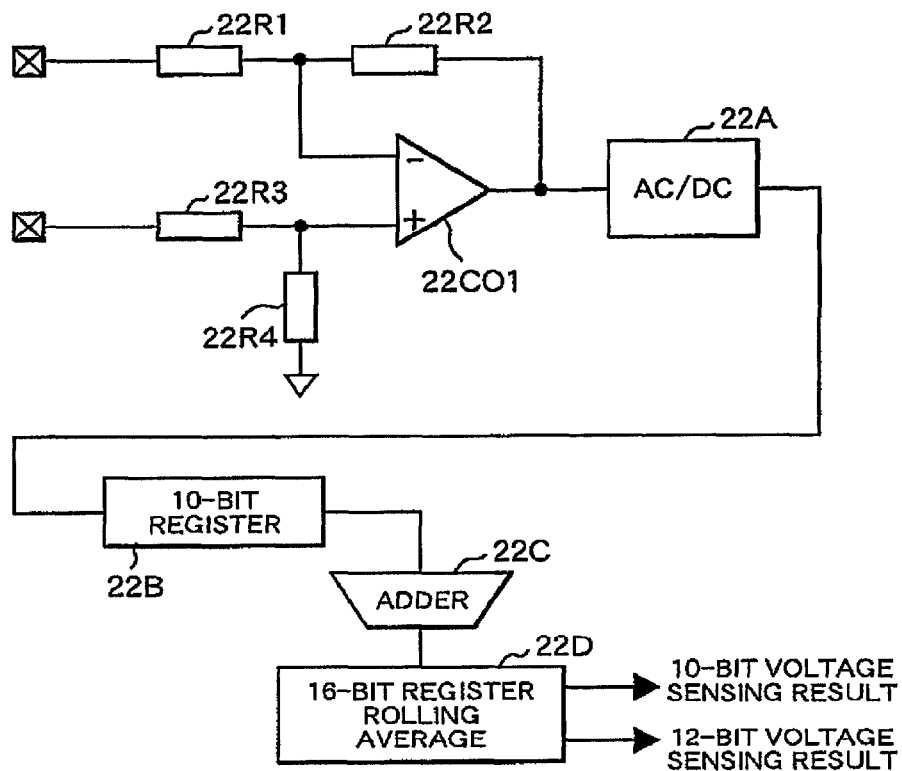
FIG. 4
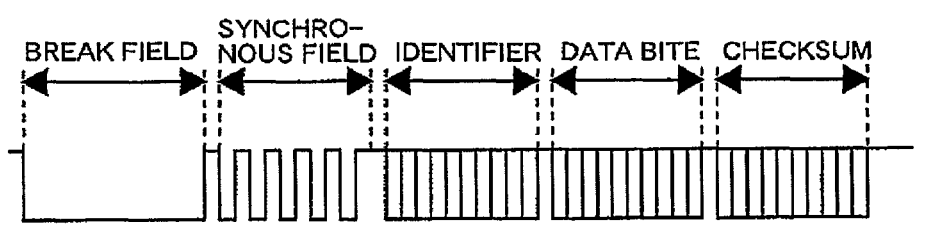
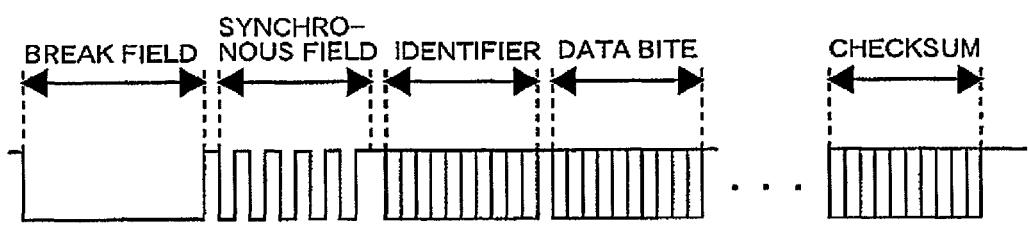

MULTI-SERIES BATTERY CONTROL SYSTEM

CROSS-REFERENCE TO RELATED APPLICATIONS

This application is a continuation application of U.S. application Ser. No. 12/415,775, filed Mar. 31, 2009, which, in turn, is a continuation application of U.S. application Ser. No. 11/117,480, filed Apr. 29, 2005 (now U.S. Pat. No. 7,511,457); and which application claims priority from Japanese application serial No. 2004-135022, filed on Apr. 30, 2004, the contents of which are hereby incorporated by reference into this application.

BACKGROUND OF THE INVENTION

The present invention relates to secondary battery (lithium battery) for vehicle or for power supply, particularly to a multi-series battery control system for managing the condition of the secondary battery (lithium battery).

In order to solve a problem that higher precision voltage sensing involves cost increase of insulation means installed for each of multiple lower control units, there has been proposed a storage battery unit aiming at cost reduction by reducing the number of insulation means, for example, refer to Japanese Patent Laid-open 2003-70179, especially pages 3-4, FIG. 1. This Patent Document aims to lower the effect of disturbance such as noise and thereby improve reliability and enable higher precision voltage sensing.

SUMMARY OF THE INVENTION

A conventional storage battery unit is so constructed as to comprise multiple series-connected battery modules, each consisting of multiple series-connected storage batteries, multiple lower control units that are provided corresponding respectively to the multiple battery modules and control the multiple storage batteries constituting the battery module, and upper control unit that controls the multiple lower control units, wherein there are provided an input terminal of the lower control unit positioned at the maximum potential among the multiple lower control units and output terminal of the lower control unit positioned at the minimum potential, insulation means or potential conversion means that connects the upper control unit, and cutout device that is installed between the output terminal of the lower control unit and storage battery in the battery module on the lower potential side and cuts out the discharge current from the storage battery in the battery module, and signal input/output terminals of the multiple lower control units are connected with each other, electrically not insulated.

This conventional storage battery unit is not satisfactory in view of high reliability.

An object of the present invention is to offer a multi-series battery control system that can realize high reliability.

In an aspect of the invention, a multi-series battery control system comprising: a plurality of unit battery cells of which unit consists of multiple battery cells connected in series; a plurality of control ICs each comprising a control circuit for controlling the unit battery cell; a main controller that sends and receives signal to/from the control ICs via an insulation; means for sending an abnormality signal, which represents the existence or the absence of abnormality of the control ICs or the battery cells, to the main controller from the control ICs, responding to the first signal outputted from the main controller via the insulation; and means for sending an abnormality contents signal of the control ICs or the battery cells, to the main controller from the control ICs, responding to the second signal outputted from the main controller via the insulation.

In another aspect of the invention, A multi-series battery control system comprising: a plurality of unit battery cells of which unit consists of multiple battery cells connected in series; a plurality of control IC chips comprising a control circuit for controlling the unit battery cell; a plurality of cell monitor IC chips each monitoring the voltage of the unit battery cell; a plurality of control ICs each consisting of the control IC chip and the cell monitor IC chip; a main controller that sends and receives signal to/from the control IC chips via an insulation; means for sending an abnormality signal, which represents the existence or the absence of abnormality of the control IC chips or the battery cells, to the main controller from the control IC chips, responding to the first signal outputted from the main controller via the insulation; and means for sending the abnormality contents signal of the control IC chip or the battery cells, to the main controller from the control IC chips, responding to the second signal outputted from the main controller via the insulation.

According to a preferred embodiment of the present invention, a high reliability multi-series battery control system can be realized.

Other objects and features of the present invention are described hereunder along with preferred embodiments.

BRIEF DESCRIPTION OF DRAWINGS

FIG. 3 is a block diagram showing a concrete embodiment of the voltage sensing means shown in FIG. 2.

FIG. 4 is a diagram showing an embodiment of communication command.

DETAILED DESCRIPTION OF THE INVENTION

The present invention can be realized by monitoring multiple series-connected battery cells as a unit and managing the condition of a battery so as to sense abnormality of IC chip circuit or battery cell and take appropriate measures.

[Embodiment 1]

An embodiment of the multi-series battery control system according to the present invention is described hereunder in detail.

Figure 1:
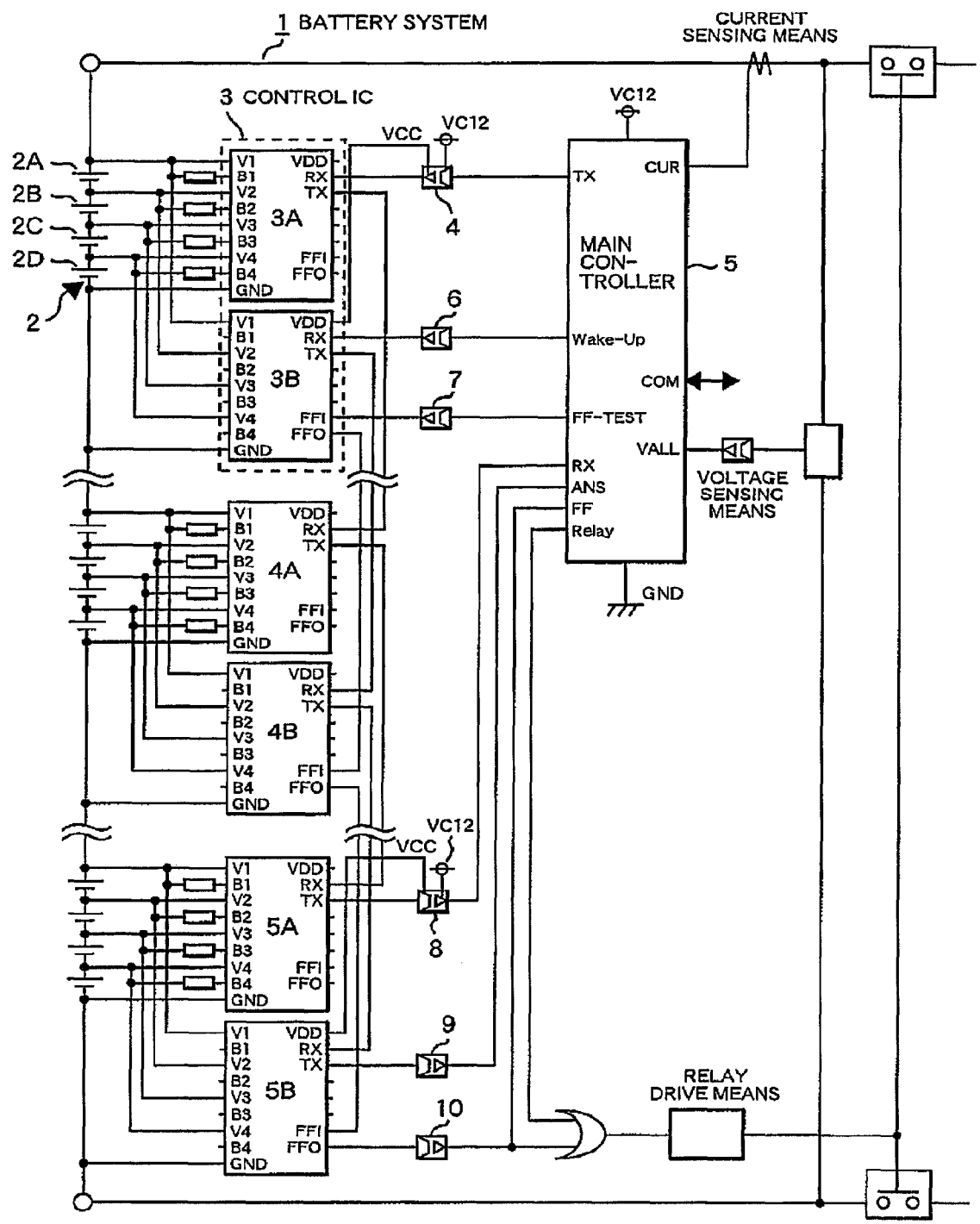
FIG. 1 is a diagram showing an embodiment of the multi-series battery control system of the present invention.

FIG. 1 shows the construction of the multi-series battery control system of the present invention.

In FIG. 1, a battery system 1 is so constructed that a unit battery cell 2 comprising four series-connected battery cells 2A, 2B, 2C, 2D is provided with a corresponding paired control IC 3 (control IC chip 3A and cell monitor IC chip 3B). The paired control IC 3 consists of two ICs: one is the control IC chip 3A that contains a control circuit and the other is the cell monitor IC chip that monitors the unit battery cell. One end of the control IC chip 3A is connected with each terminal of the battery cells 2A, 2B, 2C, 2D of the unit battery cell 2. The other end of the control IC chip 3A is connected with a main controller 5 via a high-speed insulation means 4. The main controller 5 is connected with one end of the cell monitor IC chip 3B via insulation means 6 and 7. The other end of the cell monitor IC chip 3B is connected with each terminal of the battery cells 2A, 2B, 2C, 2D.

The paired control IC 3 is provided for each unit battery cell comprising four battery cells. Although FIG. 1 shows only three paired ICs, the number of paired ICs 3 is the same number of units of all battery cells of a lithium battery where one unit comprises four battery cells.

Figure 2:
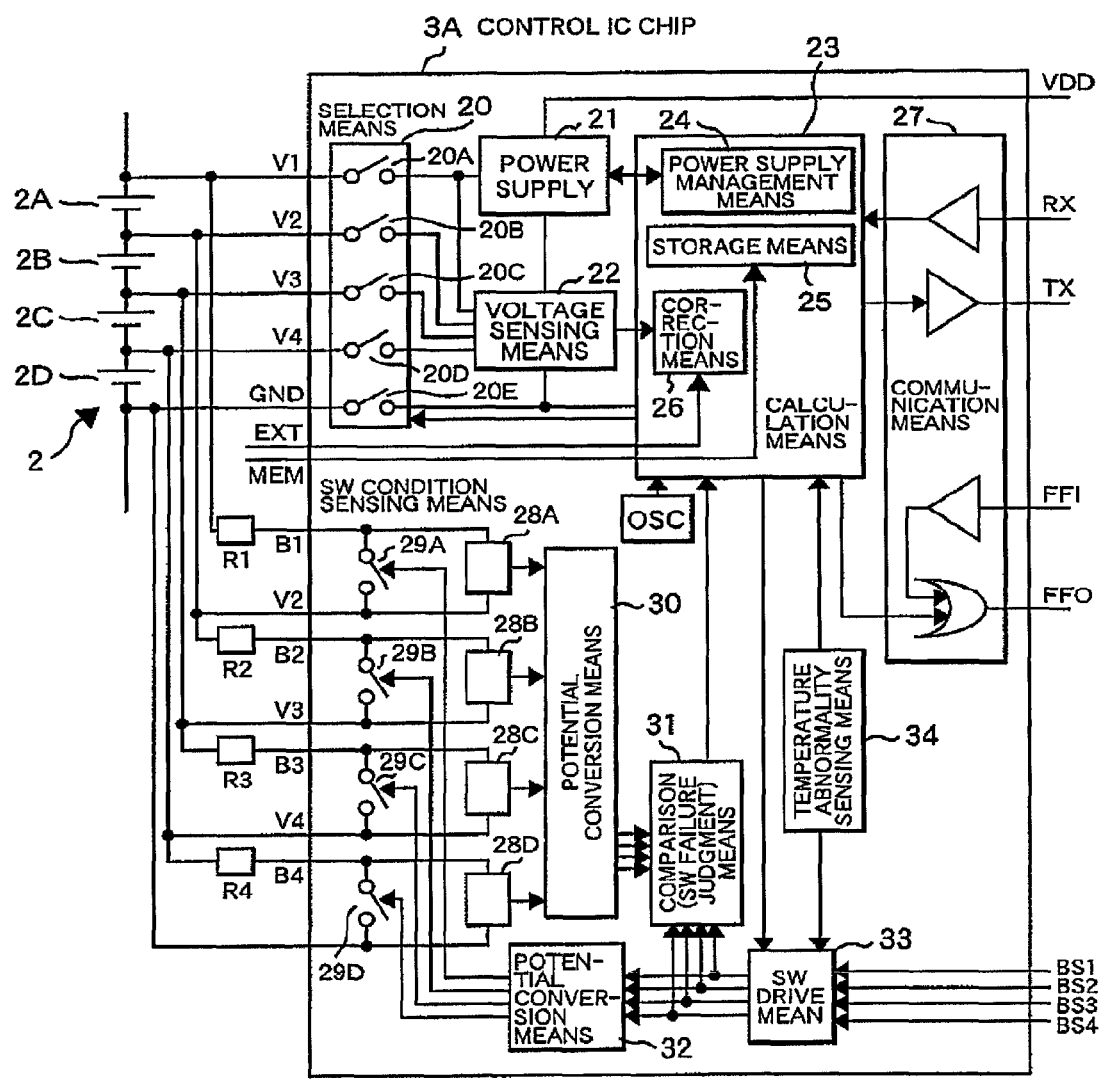
FIG. 2 is a detailed circuit diagram of the control IC chip shown in FIG. 1.

FIG. 2 shows a detailed circuit of the control IC chip 3A. Although the figure shows the control IC chip 3A only, the other control IC chip 4A, 5A . . . have the same construction. Moreover, the cell monitor IC chips 3B-5B in FIG. 1 can also completely be constituted using the same IC chip. Then, in the following explanation, FIG. 2 is referred to also to explanation of the cell monitor IC chips 3B-5B.

In FIG. 2, the (+) terminal of the battery cell 2A of the unit battery cell 2 is connected with a selection means 20 via the V1 input terminal. This selection means 20 is a multiplexer, for example. The selection means is provided with switches 20A, 20B, 20C, 20D, 20E. One end of the switch 20A is connected with the V1 input terminal and the other end of the switch 20A is connected with a power supply 21 and voltage sensing means 22. In addition, the (−) terminal of the battery cell 2A of the unit battery cell 2, which is the (+) terminal of the battery cell 2B, is connected with one end of the switch 20B of the selection means 20 via the V2 input terminal and the other end of the switch 20B is connected with the voltage sensing means 22.

In addition, the (−) terminal of the battery cell 2B of the unit battery cell 2, which is the (+) terminal of the battery cell 2C, is connected with one end of the switch 20C of the selection means 20 via the V3 input terminal and the other end of the switch 20C is connected with the voltage sensing means 22. Furthermore, the (−) terminal of the battery cell 2C of the unit battery cell 2, which is the (+) terminal of the battery cell 2D, is connected with one end of the switch 20D of the selection means 20 via the V4 input terminal and the other end of the switch 20D is connected with the voltage sensing means 22.

The (−) terminal of the battery cell 2D of the unit battery cell 2 is connected with one end of the switch 20E of the selection means 20 via the GND (ground) terminal and the other end of the switch 20E is connected with the voltage sensing means.

The power supply 21 is constructed for example as a DC/DC converter, which is made using the unit battery cells so as to convert the power of the unit battery cell 2 to a specified voltage and supply to the outside through the VDD terminal and also to supply drive power to each circuit in the control IC chip 3A.

The voltage sensing means 22 senses each terminal-to-terminal voltage between the battery cells 2A, 2B, 2C, 2D of the unit battery cell 2, and the sensed terminal-to-terminal voltage between the battery cells 2A, 2B, 2C, 2D is outputted to a calculation means 23. The calculation means comprises a power supply management means 24, storage means 25 and correction means 26. The power supply management means 24 controls ON/OFF of the power supply 21.

The storage means 25 stores each terminal-to-terminal voltage between the battery cells 2A, 2B, 2C, 2D of the unit battery cell 2 sensed by the voltage sensing means 22 separately for each battery cell 2A, 2B, 2C, 2D. To be concrete, the storage means 25 is constructed as a shift register. The correction means 26 corrects each terminal-to-terminal voltage between the battery cells 2A, 2B, 2C, 2D of the unit battery cell 2 sensed by the voltage sensing means 22.

The calculation means 23 is connected with a communication means 27. The communication means 27 receives through the RX terminal via the high-speed insulation means 4 a communication command (such as 8-bit, 10-bit or 12-bit ON/OFF signal) sent from the main controller 5. That is to say, the main controller 5 sends out a command for operating a specified control IC chip 3A to the high-speed insulation means 4, including a communication command for reading the voltage between each battery cell 2A, 2B, 2C, 2D or communication command for adjusting the voltage between each battery cell 2A, 2B, 2C, 2D of a specified unit battery cell 2. The high-speed insulation means 4 does not send out the communication command received from the main controller 5 directly to the communication means 27 but via the insulation means.

The high-speed insulation means 4 is a transformer type and as small as an IC. Being a transformer type, the high-speed insulation means 4 needs power and is driven by power supplied from the cell monitor chip 3B.

The communication means 27 generates a communication command (such as 10-bit or 12-bit ON/OFF signal), corresponding to the communication command sent from the main controller 5 via the high-speed insulation means 4, by the voltage of eight battery cells, that is, two series-connected unit battery cells and outputs it to the calculation means 23.

Figure 10:
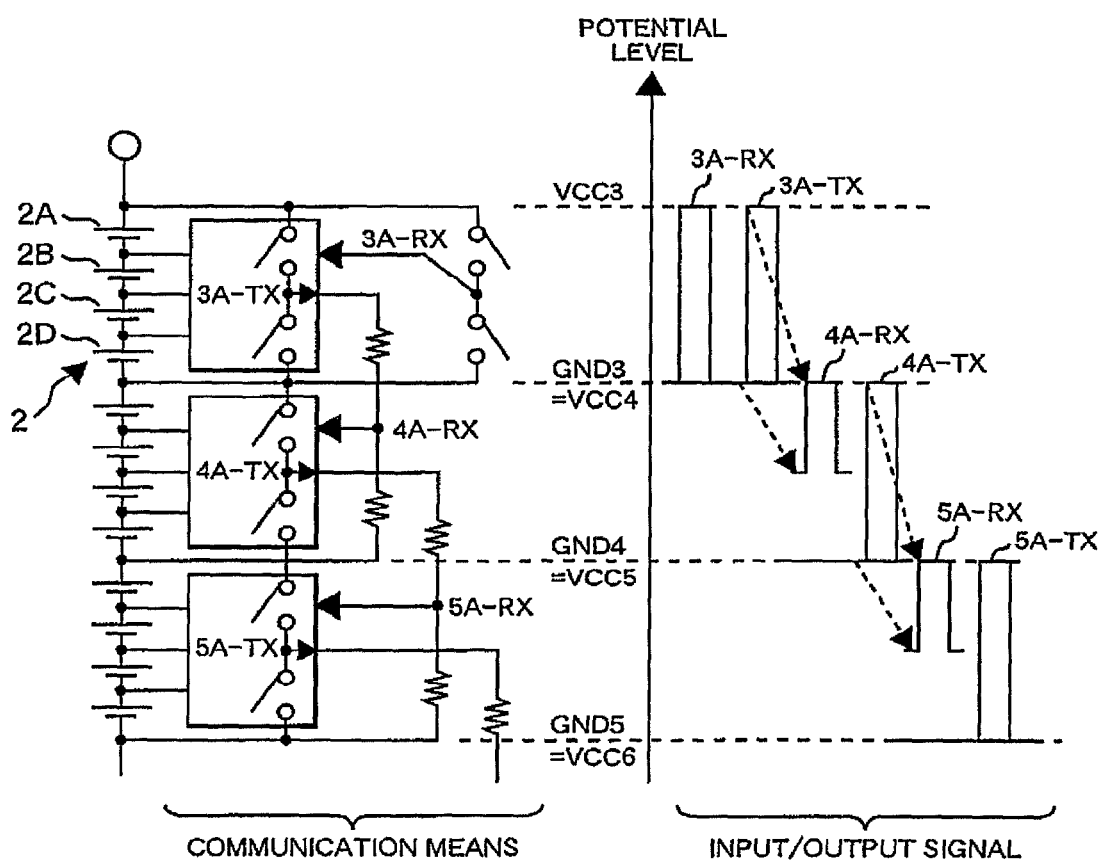
FIG. 10 is a chart for explaining how communication signal is sensed in each control IC.

How communication signal is sensed in each control IC chip 3A, 4A, . . . 5A is described hereunder, using FIG. 10.

In FIG. 10, among the control IC chip 3A, control IC chip 4A, . . . control IC chip 5A, communication signal is judged by the control IC chip 3A and control IC chip 4A, and the control IC chip 4A and control IC chip 5A. In the control IC chip 3A in FIG. 10, a VCC3 voltage level signal (Hi/Low signal of the VCC3 voltage level), of which Hi is the total voltage of the sum of each voltage of battery cells 2A, 2B, 2C, 2D of the unit battery cell 2 and Low is the GND (ground) level, is inputted into the RX terminal of the control IC chip 3A. The VCC3 voltage level signal inputted into the RX terminal of the control IC chip 3A is outputted from the TX terminal of the control IC chip 3A but the voltage is divided by a resistor, and so a divided VCC3 voltage level signal (Hi/Low signal of the VCC3 voltage level divided to ½ for example) is inputted into the RX terminal of the control IC chip 4A. That is, the communication signal is inputted into the RX terminal of the control IC chip 4A as a signal for example repeating Hi/Low of the VCC3 voltage level divided to ½. If the control IC chip 4A attempts to judge the signal outputted from the TX terminal of the control IC chip 3A using the same threshold as for the control IC chip 3A based on each voltage of the unit battery cell 2 under its control, judgment is impossible because the Low level of the signal outputted from the TX terminal of the control IC chip 3A is half the total voltage applied to the control IC chip 4A.

That is to say, in FIG. 10, the RX terminal voltage of the control IC chip 3A ranges VCC3 to GND3. The RX terminal voltage of the control IC chip 4A ranges (VCC3 to GND4)× R/2R because the voltage outputted from the TX terminal of the control IC chip 3A is divided to ½ by a resistor. The TX terminal voltage of the control IC chip 4A ranges VCC4 to GND4. The RX terminal voltage of the control IC chip 5A ranges (VCC4 to GND5)×R/2R because the voltage outputted from the TX terminal of the control IC chip 4A is divided to ½ by a resistor.

Accordingly, both input and output (RX and TX) of the highest control IC chip 3A ranges VCC to GND. The threshold of the highest control IC chip 3A for judging Hi/Low of the input (RX) is therefore ½ VCC. The output (TX) of other control IC chips (4A, . . . 5A) than the highest control IC chip 3A ranges VCC to ½ VCC. Accordingly, for smooth operation, the threshold of each control IC chip 4A, . . . 5A for judging Hi/Low of the input (RX) shall be nothing but ¾ VCC.

In addition, the (+) terminal of the battery cell 2A of the unit battery cell 2 is connected with the B1 terminal via a resistor R1. This B1 terminal is connected with one end of the SW condition sensing means 28A and the other end of the SW condition sensing means 28A is connected with the (−) terminal of the battery cell 2A of the unit battery cell 2 via the V2 terminal. And, a balancing switch 29A series-connected with the resistor R1 is inserted between the two terminals of the battery cell 2A of the unit battery cell 2.

In addition, the (+) terminal of the battery cell 2B of the unit battery cell 2 is connected with the B2 terminal via a resistor R2. This B2 terminal is connected with one end of the SW condition sensing means 28B and the other end of the SW condition sensing means 28B is connected with the (−) terminal of the battery cell 2B of the unit battery cell 2 via the V3 terminal. And, a balancing switch 29B series-connected with the resistor R2 is inserted between the two terminals of the battery cell 2B of the unit battery cell 2.

In addition, the (+) terminal of the battery cell 2C of the unit battery cell 2 is connected with the B3 terminal via a resistor R3. This B3 terminal is connected with one end of the SW condition sensing means 28C and the other end of the SW condition sensing means 28C is connected with the (−) terminal of the battery cell 2C of the unit battery cell 2 via the V4 terminal. And, a balancing switch 29C series-connected with the resistor R3 is inserted between the two terminals of the battery cell 2C of the unit battery cell 2.

Furthermore, the (+) terminal of the battery cell 2D of the unit battery cell 2 is connected with the B4 terminal via a resistor R4. This B4 terminal is connected with one end of the SW condition sensing means 28D and the other end of the SW condition sensing means 28D is connected with the (−) terminal of the battery cell 2D of the unit battery cell 2. And, a balancing switch 29D series-connected with the resistor R4 is inserted between the two terminals of the battery cell 2D of the unit battery cell 2.

These SW condition sensing means 28A, 28B, 28C, 28D sense the voltage between both ends of the balancing switches 29A to 29D, respectively. They also sense abnormality of the balancing switches 29A, 29B, 29C, 29D. That is to say, if the terminal voltage of the battery cells 2A, 2B, 2C, 2D is outputted while the balancing switches 29A, 29B, 29C, 29D are ON, the balancing switches 29A, 29B, 29C, 29D can be judged abnormal. These SW condition sensing means 28A, 28B, 28C, 28D are a voltage sensing circuit comprising a differential amplifier.

These balancing switches 29A, 29B, 29C, 29D are switches that short-circuits each battery cell via the resistor R1, resistor R2, resistor R3, and resistor R4 respectively so as to discharge the series-connected battery cells 2A, 2B, 2C, 2D constituting the unit battery cell 2 and match the battery cell voltage of the four battery cells 2A, 2B, 2C, 2D constituting the unit battery cell with each other. To be concrete, they are constructed as a MOS type FET. In addition, the SW condition sensing means 28A senses whether the balancing switch 29A is operating correctly, SW condition sensing means 28B senses whether the balancing switch 29B is operating correctly, SW condition sensing means 28C senses whether the balancing switch 29C is operating correctly, and SW condition sensing means 28D senses whether the balancing switch 29D is operating correctly. That is, the SW condition sensing means 28A to 28D continuously monitor the voltage of the balancing switches 29A to 29D, and when the balancing switches 29A, 29B, 29C, 29D are turned ON, the SW condition sensing means 28A, 28B, 28C, 28D sense a voltage near 0 (zero), respectively.

A potential conversion means 30 is connected with these SW condition sensing means 28A, 28B, 28C, 28D. The potential conversion means 30 convert the voltage between each battery cell 2A, 2B, 2C, 2D sensed by the SW condition sensing means 28A, 28B, 28C, 28D to a specific potential (potential suitable for processing) and output it to a comparison means 31. That is, since the potential levels between each battery cell 2A, 2B, 2C, 2D are different, the potential conversion means 30 converts them to such potential levels that can be compared with each other.

The comparison means 31, into which a drive signal of a SW drive means 33 is inputted, compares the drive signal with the voltage, which is the voltage between each balancing switches 29A, 29B, 29C, 29D sensed by the SW condition sensing means 28A, 28B, 28C, 28D, and converted into a specific voltage (potential suitable for processing) and outputted from the potential conversion means 30, and judges whether the balancing switches 29A, 29B, 29C, 29D are normal or abnormal.

On the other hand, a signal for driving the balancing switch 29A is inputted via the BS1 terminal, signal for driving the balancing switch 29B is inputted via the BS2 terminal, signal for driving the balancing switch 29C is inputted via the BS3 terminal, and signal for driving the balancing switch 29D is inputted via the BS4 terminal from the main controller 5 into the SW drive means 33, respectively. The SW drive means 33 converts the switch signal sent from the main controller 5 into each switch drive signal and outputs it to the comparison means 31 connected with the SW drive means and potential conversion means 32.

The potential conversion means 32 receives the switch drive signal sent from the SW drive means 33, converts it to a drive voltage signal (to be concrete, a gate signal) for turning ON/OFF the balancing switches 29A, 29B, 29C, 29D, and supplies it (to be concrete, supplies a gate voltage) to the balancing switches 29A, 29B, 29C, 29D When abnormality of the balancing switches 29A, 29B, 29C, 29D is sensed by the comparison means 31, it identifies which balancing switch 29A, 29B, 29C, 29D is abnormal based on the switch drive signal outputted from the SW drive means 33 and outputs the result to the calculation means 23. When abnormality is sensed by the comparison means 31, the calculation means 23 identifies an abnormal balancing switch and sends a signal informing the abnormality is sent to the main controller 5 from the FFO terminal of the communication means 27 or TX terminal of the communication means 27.

In FIG. 2, the BS1 to BS4 terminals in the SW drive means 33 are used to input a signal for turning ON the balancing switches 19A to 19D from the outside, and the signal inputted from these terminals BS1 to BS4 drives the SW drive means 33 and the SW drive means 33 sends out an ON signal of the balancing switches 19A to 19D to the potential conversion means 32. The potential conversion means 32 receives the switch drive signal sent from the SW drive means 33, converts it to a drive voltage signal (to be concrete, a gate signal) for turning ON the balancing switches 29A, 29B, 29C, 29D, and supplies it (to be concrete, supplies a gate voltage) to the balancing switches 29A, 29B, 29C, 29D.

34 in FIG. 2 is a temperature abnormality sensing means, and the temperature abnormality sensing means 34 senses the temperature of the control IC chip 3A, checking whether it reaches a preset temperature. If the temperature abnormality sensing means 34 senses a temperature in excess of the preset temperature, it sends out a signal to the SW drive means 33 so as to stop supplying current to the balancing switches 29A to 29D and terminate the charging control by the balancing switches 29A, 29B, 29C, 29D so that no more heat is generated.

FIG. 3 shows a concrete embodiment of the voltage sensing means 22 shown in FIG. 2.

The voltage sensing means 22 in FIG. 3 is connected with the selection means 20. The voltage sensing means 22 is provided with a resistor 22R1 connected with the (+) terminal of the battery cells 2A, 2B, 2C, 2D of which connection is switched by the switches 20A, 20B, 20C, 20D, 20E of the selection means 20. The other end of the resistor 22R1 is connected with one end of a resistor 22R2 and the (−) input terminal of the operation amplifier 220P1. The other end of the resistor 22R2 is connected with an AC/DC converter 22A.

On the other hand, there is provided a resistor 22R3 connected with the (−) terminal of the battery cells 2A, 2B, 2C, 2D of which connection is switched by the switches 20A, 20B, 20C, 20D, 20E of the selection means 20, and the other end of the resistor 22R3 is connected with one end of a resistor 22R4 and the (+) input terminal of the operation amplifier 220P1. The output terminal of the operation amplifier 220P1 is connected with the AC/DC converter 22A. The other end of the resistor 22R4 is connected with the ground.

The output terminal of the AC/DC converter 22A is connected with an adder 12C via a 10-bit resistor 22B, and the adder 12C is connected with a 16-bit resistor rolling average 22D.

Because a duplex integration type is employed as explained above, noise content in the input voltage can be filtered. In addition, because a 16-bit resistor rolling average is employed, resolution can be improved and sensed value can be filtered.

FIG. 4 shows an embodiment of communication command. This communication command is sent from the main controller 5 and inputted to the RX terminal of the communication means 27 shown in FIG. 2. A unit data of this communication command comprises 8 bits and a communication command contains 5 bytes. The first 8 bits of the communication command are a break field informing an incoming signal, second 8 bits are a synchronous field as a signal for synchronization, third 8 bits are an identifier equivalent to an address showing which control IC chip 3A applies, fourth 8 bits are a data byte showing the communication detail (control detail), and fifth 8 bits are a checksum. These communication commands consisting of 5 bytes are sent in series.

Figure 5:
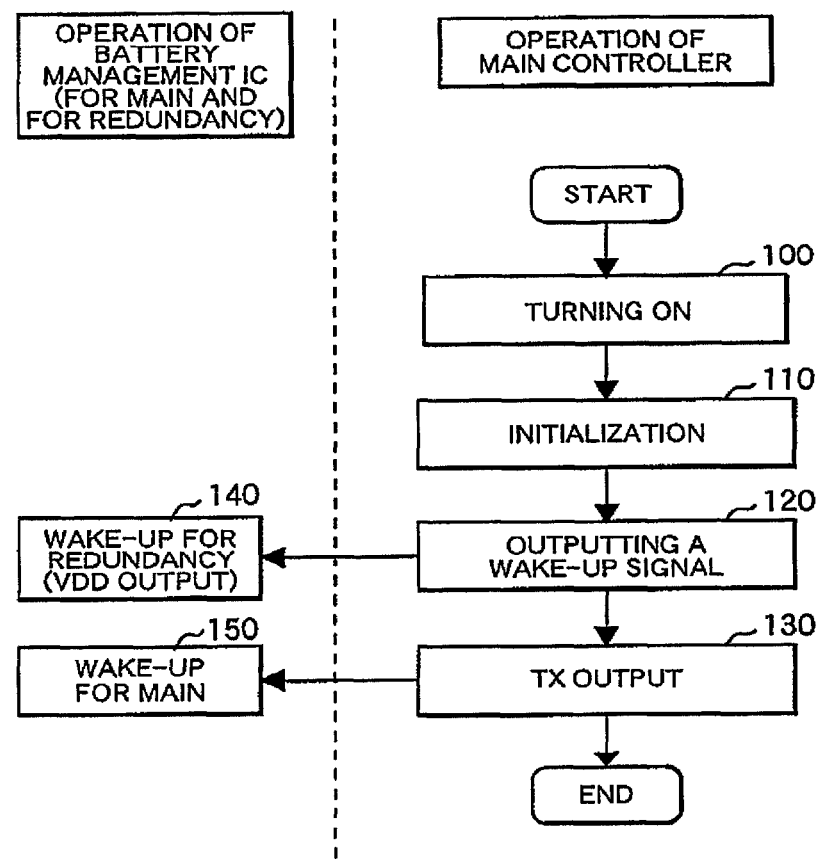
FIG. 5 is a chart showing the wake-up sequence in starting up the system.

FIG. 5 shows the wake-up sequence in starting up the system. That is, this wake-up sequence is the operation flow for actuating the control IC chip 3A and cell monitor IC chip 3B in turning on the main controller 5.

In FIG. 5, when the main controller 5 shown in FIG. 2 is turned on (key-switch is turned on) in step 100, the main controller 5 is initialized in step 110. After the initialization of the main controller 5 in step 110, a wake-up signal shown in FIG. 6 (A) is outputted from the wake-up terminal of the main controller 5 to the RX terminal of the cell monitor IC chip 3B via the insulation means 6 in step 120. The RX terminal of the cell monitor IC chip 3B is for waking up the cell monitor IC chip 3B and so, when a wake-up signal is inputted to the RX terminal of the cell monitor IC chip 3B, the cell monitor IC chip 3B is actuated (wakes up). When this cell monitor IC chip 3B wakes up, the power VCC supplied from the battery cells 2A, 2B, 2C, 2D as shown in FIG. 6 (B) is outputted from the VDD terminal of the cell monitor IC chip 3B.

Figure 6:
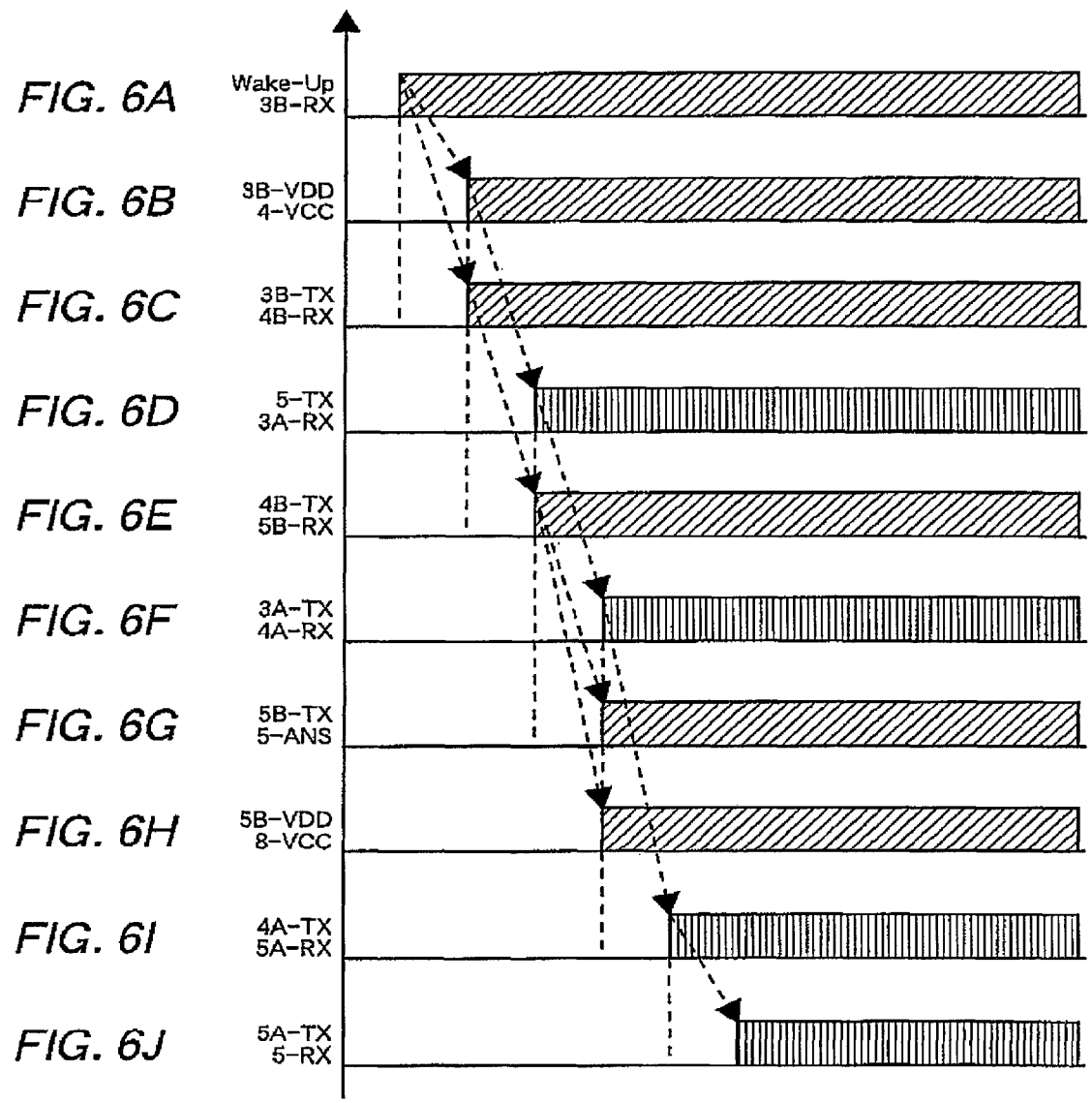
FIG. 6A-6J is a chart showing the sent/received wake-up signals on each control IC shown in FIG. 5.

When a wake-up signal shown in FIG. 6 (A) is outputted from the wake-up terminal of the main controller 5 to the RX terminal of the cell monitor IC chip 3B via the insulation means 6 in step 120, the cell monitor IC chip 3B supplies the power VCC shown in FIG. 6 (B) from the VDD terminal to the high-speed insulation means 4 (VDD output) in step 140. When the power VCC shown in FIG. 6 (B) is supplied from the VDD terminal of the cell monitor IC chip 3B to the high-speed insulation means 4, the high-speed insulation means 4 wakes up. When the high-speed insulation means 4 wakes up, the wake-up signal shown in FIG. 6 (D) outputted from the TX terminal of the main controller 5 can be outputted to the RX terminal of the control IC chip 3A.

As explained above, the cell monitor IC chip 3B wakes up when a wake-up signal shown in FIG. 6 (A) outputted from the wake-up terminal of the main controller 5 via the insulation means 6 is received at the RX terminal in step 120, and a wake-up signal shown in FIG. 6 (D) for waking up the control IC chip 3A is outputted from the TX terminal of the main controller 5 to the RX terminal of the control IC chip 3A via the high-speed insulation means 4 in step 130. In step 130, a wake-up signal shown in FIG. 6 (D) for waking up the control IC chip 3A is outputted from the TX terminal of the main controller 5 to the RX terminal of the control IC chip 3A via the high-speed insulation means 4 in step 130, and when it is received at the RX terminal of the control IC chip 3A, the control IC chip 3A wakes up in step 150.

When the cell IC chip 3B is woken up by a wake-up signal shown in FIG. 6 (A) outputted from the wake-up terminal of the main controller 5 to the RX terminal of the cell monitor IC chip 3B via the insulation means 6, the cell IC chip 3B copies the wake-up signal shown in FIG. 6 (A) as a wake-up signal shown in FIG. 6 (C) and outputs it from the RX terminal of the cell monitor IC chip 3B to the RX terminal of the cell monitor IC chip 4B in the next stage. The cell IC chip 4B is woken up by a wake-up signal shown in FIG. 6 (C) outputted from the TX terminal of the cell monitor IC chip 3B, and the cell IC chip 4B copies the wake-up signal shown in FIG. 6 (C) outputted from the TX terminal of the cell monitor IC chip 3B and outputs it as a wake-up signal shown in FIG. 6 (E) from the TX terminal of the cell monitor IC chip 4B to the RX terminal of the cell monitor IC chip 5B in the last stage. There are multiple cell IC chips provided between the cell monitor IC chip 4B and the cell monitor IC chip 5B in the last stage, but they are omitted in FIG. 1.

On the other hand, the power supplied from the battery cells 2A, 2B, 2C, 2D is outputted from the VDD terminal of the cell monitor IC chip 3B to the high-speed insulation means 4, the high-speed insulation means 4 is turned on, and a wake-up signal shown in FIG. 6 (D) is outputted from the TX terminal of the main controller 5 to the RX terminal of the control IC chip 3A via the high-speed insulation means 4. When this wake-up signal shown in FIG. 6 (D) is inputted to the RX terminal of the control IC chip 3A, the control IC chip 3A wakes up. When the control IC chip 3A wakes up, the control IC chip 3A copies the wake-up signal shown in FIG. 6 (D) sent from the TX terminal of the main controller 5 and outputs it as a wake-up signal shown in FIG. 6 (F) from the TX terminal of the control IC chip 3A to the RX terminal of the control IC chip 4A in the next stage.

The cell IC chip 4A is woken up by a wake-up signal shown in FIG. 6 (F) outputted from the TX terminal of the cell monitor IC chip 3A, and the cell IC chip 4A copies the wake-up signal shown in FIG. 6 (F) outputted from the TX terminal of the cell monitor IC chip 3A and outputs it as a wake-up signal shown in FIG. 6 (I) from the TX terminal of the cell monitor IC chip 4A to the RX terminal of the cell monitor IC chip 5A in the last stage. There are multiple cell IC chips provided between the cell monitor IC chip 4A and the cell monitor IC chip 5A in the last stage, but they are omitted in FIG. 1.

The control IC chip 3A, control IC chip 4A, ... control IC chip 5A and the cell monitor IC chip 3B, cell monitor IC chip 4B, ... cell monitor IC chip 5B wake up as explained above, and the battery management IC for managing the battery cells 2A to 2N wakes up. In addition, there is provided a VDD terminal on each control IC chip 3A, control IC chips 4A to 5A, cell monitor IC chip 3B, and cell monitor IC chips 4B to 5B, and so power can be supplied to the outside by appropriate utilization of these VDD terminals.

After the cell monitor IC chip 3B wakes up as above, the cell monitor IC chip 4B and remaining cell monitor IC chips wake up by repeating a similar operation. The cell IC chip 5B wakes up as it receives a wake-up signal shown in FIG. 6 (E) outputted from the TX terminal of the cell monitor IC chip 4B at the RX terminal. When the cell monitor IC chip 5B wakes up as it receives a wake-up signal shown in FIG. 6 (E) outputted from the TX terminal of the cell monitor IC chip 4B to the RX terminal of the cell monitor IC chip 5B, the cell monitor IC chip 5B copies the wake-up signal shown in FIG. 6 (E) and outputs it as a wake-up signal shown in FIG. 6 (G) from the TX terminal of the cell monitor IC chip 5B to the ANS terminal of the main controller 5.

When the cell monitor IC chip 5B wakes up, it supplies the power VCC shown in FIG. 6 (H) from the VDD terminal to the high-speed insulation means 8 (VDD output). When the power VCC shown in FIG. 6 (H) is supplied from the VDD terminal of the cell monitor IC chip 5B to the high-speed insulation means 8, the high-speed insulation means 8 wakes up. When the high-speed insulation means 8 wakes up, the high-speed insulation means 8 is turned ON and so the TX terminal of the control IC chip 5A can communicate with the RX terminal of the main controller 6. That is, when the high-speed insulation means 8 wakes up, a wake-up signal shown in FIG. 6 (J) is sent from the TX terminal of the control IC chip 5A to the RX terminal of the main controller 5. When the wake-up signal shown in FIG. 6 (J) from the TX terminal of the control IC chip 5A is received at the RX terminal of the main controller 5, the main controller 5 confirms that the control IC chip 3A, control IC chip 4A, ... control IC chip 5A and the cell monitor IC chip 3B, cell monitor IC chip 4B, ... cell monitor IC chip 5B have woken up and the battery management IC for managing the battery cells 2A to 2N has woken up correctly. Whether the cell monitor IC chip 3B, cell monitor IC chip 4B, ... cell monitor IC chip 5B have woken up is judged by confirming that the high-speed insulation means 8 is turned ON and a wake-up signal shown in FIG. 6 (J) is sent from the TX terminal of the control IC chip 5A to the RX terminal of the main controller 5 is the cell monitor IC chip 5B has woken up.

The battery management IC is provided with a high-speed insulation means 4 on its top stage and high-speed insulation means 8 on its bottom stage for the purpose of insulation and so it is not grounded to chassis (power supply is lifted from the chassis).

Figure 7:
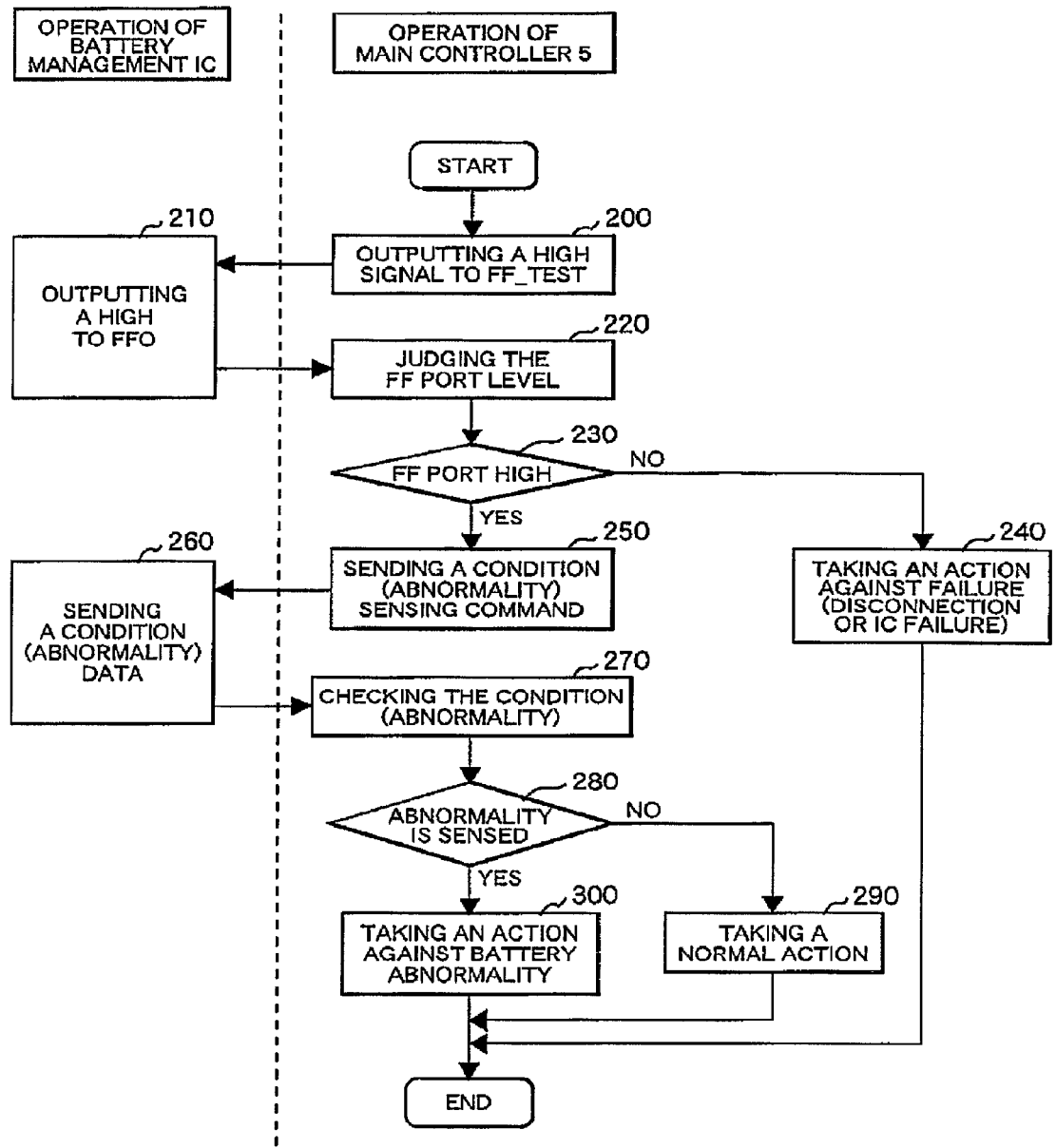
FIG. 7 is a chart showing an FF-TEST subroutine.

FIG. 7 shows an FF-TEST subroutine. That is, the FF-TEST subroutine is a processing flow for inputting a test signal from the FFI of the cell monitor IC chip 3B and sensing abnormality in the circuits of the cell monitor IC chips 3B to 5B.

In FIG. 7, a High signal is sent from the FF-TEST terminal of the main controller 5 as shown in FIG. 1 to the FFI terminal of the communication means of the cell monitor IC chip 3B shown in FIG. 1 via an insulation means 7 in step 200. When a High signal is sent to the FFI terminal of the communication means of the cell monitor IC chip 3B in step 200, the cell monitor IC chip 3B outputs the High signal, without adding any processing, from the FFO terminal to the FFI terminal of the cell monitor IC chip 4B in the next stage. Similarly, when a High signal is sent to the FFI terminal of the communication means of the cell monitor IC chip 4B, the cell monitor IC chip 4B outputs the High signal, without adding any processing, from the FFO terminal to the FFI terminal of the cell monitor IC chip 5B in the next stage. Then, when a High signal is sent to the FFI terminal of the communication means of the cell monitor IC chip 5B, the cell monitor IC chip 5B outputs the High signal, without adding any processing, from the FFO terminal to the main controller 5. When a signal is outputted from the FFO terminal of the communication means 27, the FF port level is judged based on the signal sent from the FFO terminal to the main controller 5 in step 220. When the FF port level is judged based on the signal outputted from the FFO terminal and sent to the main controller 5 in step 220, the main controller 5 judges whether the FF port level is High or not in step 230.

If the main controller 5 judges that the FF port level is not High (is Low) in step 230, it takes an action needed in a case the circuit is disconnected somewhere or the cell monitor IC chip itself is abnormal.

If the main controller 5 judges the FF port level is High in step 230, it is necessary in step 250 to check if the returned High signal is a signal representing normality (High signal) that has been inputted by chance in spite of overcharging or over-discharging. That is, in step 250, it sends a condition (abnormality) sensing command, which is a command for sensing other abnormality (abnormality of battery cell), to the RX terminal of the communication means 27 provided on the control IC chip 3A. When this condition (abnormality) sensing command is sent to the controller 5 and RX terminal of the communication means 27 of the control IC chip 3A, a condition (abnormality) data, which is a data showing the current condition, is sent from the TX terminal of the communication means 27 of the control IC chip 3A to the main controller 5 in step 260. When this condition (abnormality) data is sent from the TX terminal of the communication means 27 to the main controller 5, the main controller 5 checks the condition (abnormality) in step 270 and judges whether the condition (abnormality) data sent from the TX terminal of the communication means 27 is a signal indicating abnormality in step 280. In a similar manner, it checks the condition (abnormality) of the control IC chip 4A and control IC chip 5A and judges whether the condition (abnormality) data sent from the TX terminal of the communication means 27 is a signal indicating abnormality. If the condition (abnormality) data sent from the TX terminal of the communication means 27 is judged to be a signal indicating no abnormality in step 280, it takes a normal action and finishes the flow. If the condition (abnormality) data sent from the TX terminal of the communication means 27 is judged to be a signal indicating abnormality in step 280, it takes an action against battery abnormality and finishes the flow.

Figure 8:
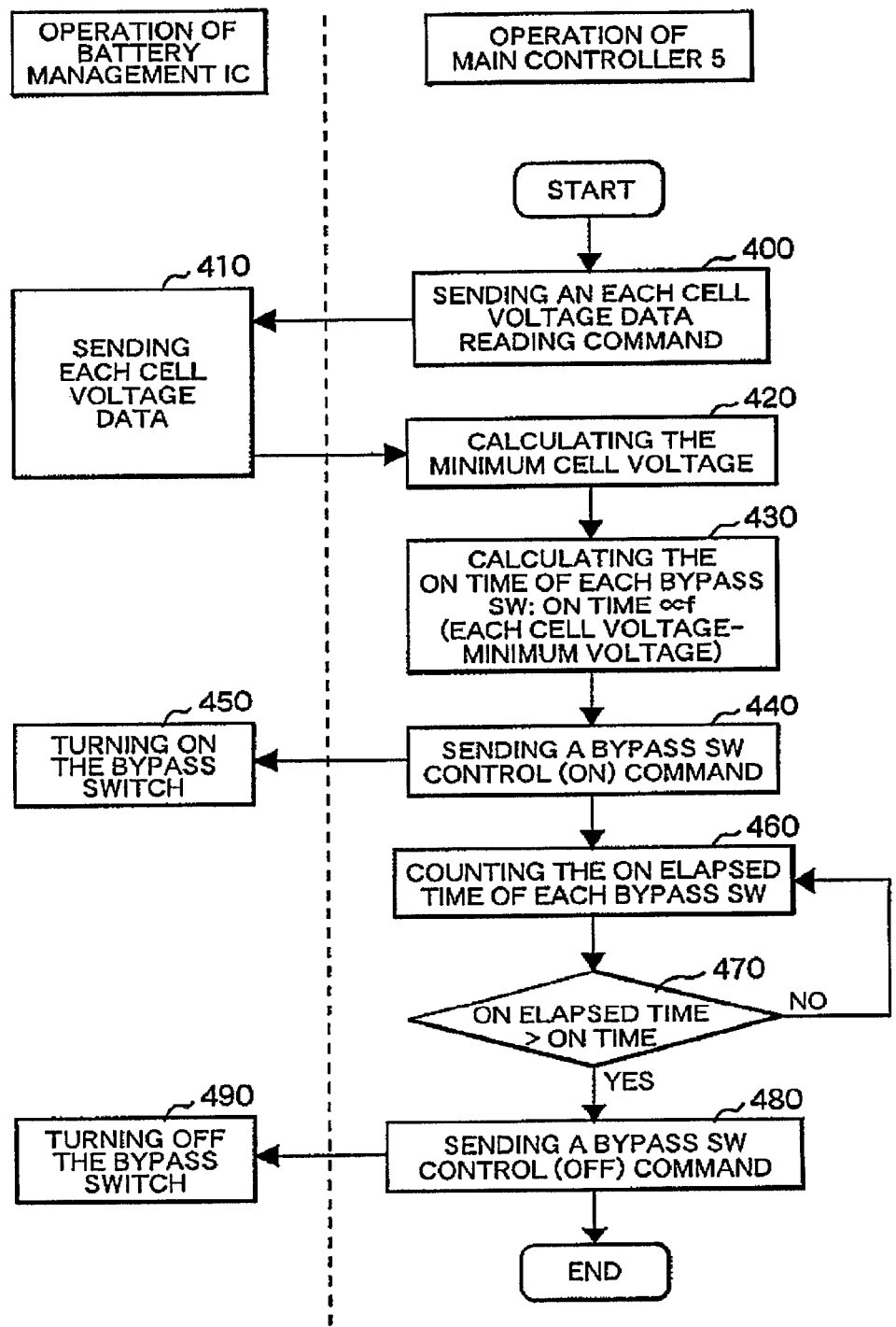
FIG. 8 is a chart showing a balancing subroutine for switching the balancing switch.

FIG. 8 shows a balancing subroutine for switching the balancing switches 29A, 29B, 29C, 29D. That is, this balancing subroutine is a processing flow for discharging the series-connected battery cells 2A, 2B, 2C, 2D constituting the unit battery cell 2 and matching the battery cell voltage of the four battery cells 2A, 2B, 2C, 2D constituting the unit battery cell with each other.

In step 400 in FIG. 8, the main controller 5 sends each battery cell voltage reading command, which is a command for reading the voltage data of each battery cell 2A to 2D, to the RX terminal of the communication means 27 in FIG. 2. When the each battery cell voltage reading command is sent in step 400, the each battery cell voltage reading command judges control particulars and reads the battery cell voltage of each battery cell 2A, 2B, 2C, 2D, periodically updated and stored in the storage means, in the calculation means 23 of the control IC chip 3A and sends in series each battery cell voltage data from the TX terminal to the main controller 5. When each battery cell voltage data from the control IC chip 3A is received, the main controller 5 finds the minimum battery cell voltage out of each battery cell voltage data received and calculates the minimum cell voltage so as to calculate the discharging time of each battery cell in step 420. After calculating the minimum cell voltage in step 420, it calculates the ON time of each balancing switch 29A, 29B, 29C, 29D in step 430. The ON time of each balancing switch 29A, 29B, 29C, 29D is calculated by subtracting the minimum cell voltage from each battery cell voltage.

In step 440, a bypass SW control (ON) command for ON control of each balancing switch 29A, 29B, 29C, 29D is sent from the main controller 5 to the RX terminal of the communication means 27 shown in FIG. 2. When the bypass SW control (ON) command is sent in step 440, the bypass control (ON) command judges control particulars in the calculation means 23 of the control IC chip 3A and drives the SW drive means 33 so that a switch drive signal (a signal specifying which switch to drive) is outputted from the SW drive means 33 to the potential conversion means 32, and a selected balancing switch out of 29A, 29B, 29C, 29D is turned ON in step 450. When the selected balancing switch out of 29A, 29B, 29C, 29D is turned ON, one of the battery cells 2A, 2B, 2C, 2D discharges.

When the selected balancing switch out of 29A, 29B, 29C, 29D is turned ON in step 450, the main controller 5 counts the ON elapsed time of each bypass SW (balancing switch) 29A, 29B, 29C, 29D in step 460. When the ON elapsed time of each bypass SW is counted in step 460, whether the ON elapsed time of each bypass SW (balancing switch) 29A, 29B, 29C, 29D becomes greater than the ON time in step 470. That is, in step 470, the main controller waits until the ON elapsed time of each bypass SW (balancing switch) 29A, 29B, 29C, 29D becomes greater than the ON time.

When the ON elapsed time of each bypass SW (balancing switch) 29A, 29B, 29C, 29D is judged greater than the ON time in step 470, a bypass SW control (OFF) command for OFF control of each balancing switch 29A, 29B, 29C, 29D is sent from the main controller 5 to the RX terminal of the communication means 27 shown in FIG. 2 in step 480. When the bypass SW control (OFF) command is sent in step 480, the bypass control (OFF) command judges control particulars in the calculation means 23 of the control IC chip 3A and controls the SW drive means 33 so that a switch drive signal (a signal specifying which switch to drive) is outputted from the SW drive means 33 to the potential conversion means 32, and a selected balancing switch out of 29A, 29B, 29C, 29D is turned OFF in step 490. When the selected balancing switch out of 29A, 29B, 29C, 29D is turned OFF, one of the battery cells 2A, 2B, 2C, 2D stops discharging. A similar operation applies to the control IC chip 4A and control IC chip 5A.

Figure 9:
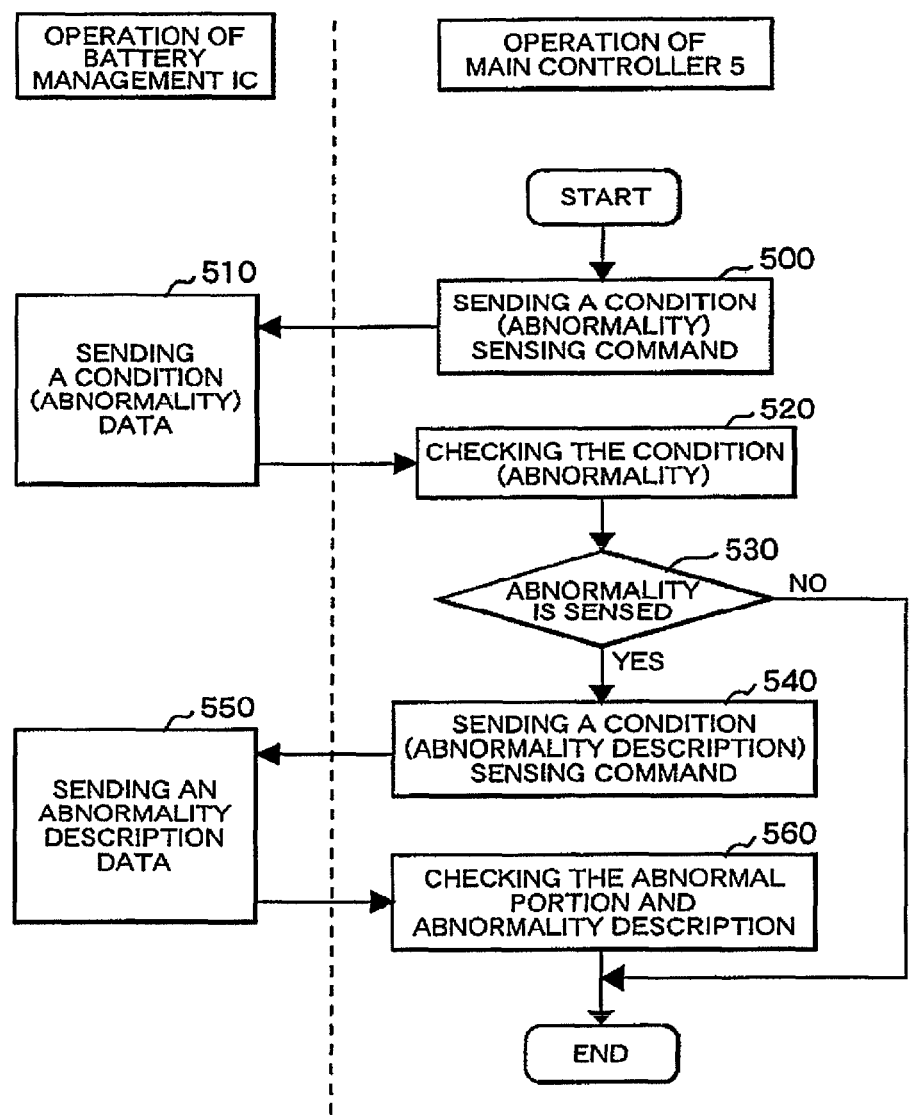
FIG. 9 is a flow chart showing an operation flow for testing abnormality of battery cell or IC chip.

FIG. 9 shows an operation flow for checking whether the control IC chips 3A to 5A or each battery cell is normal or not.

To start with, in step 500, a condition (abnormality) sensing command (the first signal) is sent from the TX terminal of the main controller 5 to the RX terminal of the control IC chip 3A. When a condition (abnormality) sensing command is sent from the TX terminal of the main controller 5, the control IC chip 3A receives the condition (abnormality) sensing command.

When the condition (abnormality) sensing command is sent from the TX terminal of the main controller 5 in step 500, the control IC chip 3A, control IC chip 4A, ... control IC chip 5A receives it in turn and the cell monitor IC chip 5B on the last stage sends it to the main controller 5.

That is, the control IC chip 3A that has received the condition (abnormality) sensing command adds an abnormality signal representing the existence or the absence of abnormality in own range, and sends the condition (abnormality) sensing command to the RX terminal of the next control IC chip 4A. When the condition (abnormality) sensing command is outputted from the TX terminal of the control IC chip 3A, the control IC chip 4A receives the condition (abnormality) sensing command and sends the condition (abnormality) sensing command to the TX terminal of the next control IC chip 5A. Consequently, when the control IC chip 5A on the last stage receives the condition (abnormality) sensing command sent from the TX terminal of the control IC chip 4A, it sends the condition (abnormality) sensing command received through the TX terminal of the control IC chip 5A to the RX terminal of the main controller 5 via the insulation means 10.

When the control IC chip 3A, control IC chip 4A, ... control IC chip 5A receives the command in turn and the cell monitor IC chip 5B on the last stage sends it to the main controller 5 in step 510, the main controller 5 that has received the condition (abnormality) sensing command from the control IC chip 5A checks the condition (abnormality) in step 520. Which of the control IC chip 3A, control IC chip 4A, ... control IC chip 5A or corresponding battery cells is abnormal can be judged from the condition (abnormality) sensing command returned to the main controller 5.

After checking the condition (abnormality) of the control IC chip 3A, control IC chip 4A, ... control IC chip 5A in step 520, the main controller 5 judges whether abnormality is found on any of the control IC chips or corresponding battery cells in step 530. If it judges no abnormality is found on any of the control IC chips or corresponding battery cells in step 530, it finishes the flow. If the main controller 5 judges abnormality is found on any of the control IC chip 4A, ... control IC chip 5A in step 530, a condition (abnormality detail) sensing command (the second signal) for specifying the address of the control IC chip on which abnormality is sensed and identifying the abnormality detail is sent from the TX terminal of the main controller 5 to the RX terminal of the control IC chip 3A via the insulation means 7 in step 540.

When the condition (abnormality detail) sensing command is sent from the TX terminal of the main controller 5 in step 540, the control IC chip 3A receives it in step 550 and then a control IC chip having different address than the specified sends the condition (abnormality detail) sensing command as it is to the control IC chip on the next stage. This sending and receiving is performed sequentially as follows: the control IC chip 3A receives the condition (abnormality detail) sensing command through the RX terminal and sends it from the TX terminal to the RX terminal of the control IC chip 4A, and the control IC chip 4A sends it from the TX terminal to the RX terminal of the control IC chip 5A, and the control IC chip 5A sends the condition (abnormality detail) sensing command received from the control IC chip 4A from the TX terminal of the control IC chip 5A to the RX terminal of the main controller 5 via the insulation means 10.

When abnormality is sensed based on the condition (abnormality detail) sensing command that is received from the control IC chip 4A and sent from the TX terminal of the control IC chip 5A to the RX terminal of the main controller 5 via the insulation means 9, a signal is outputted from the Relay terminal of the main controller 5 so as to drive a relay drive circuit and turn OFF the relay.

When the control IC chip 3A, control IC chip 4A, . . . control IC chip 5A receives the command in turn and the cell monitor IC chip 5A on the last stage sends it to the main controller 5 in step 550, the main controller 5 having received the condition (abnormality detail) sensing command from the control IC chip 5A checks the abnormal portion and abnormality detail in the control IC chip 3A, control IC chip 4A, . . . control IC chip 5A in step 560 and finishes the flow.

The main controller 5 first sends an alert signal for sending a signal (break field) from the TX terminal of the main controller 5 to the RX terminal of the control IC chip 3A and then sends a synchronous signal for receiving an incoming signal synchronously, and after that, sends out the first signal for sensing abnormality continuously. Responding to the first signal for sensing abnormality, an abnormality sensed signal showing abnormality is sensed on one of the control IC chip 3A, control IC chip 4A, . . . control IC chip 5A or corresponding battery cells is sent back with an identified address of abnormal control IC chip. When this abnormality sensed signal which represents the existence or the absence of abnormality of the control IC chip or the battery cells is received, the main controller 5 sends out the second signal for identifying the abnormality detail based on the abnormal sensed signal. This signal for identifying the abnormality detail specifies which control IC chip shall send what type of information, and the abnormality detail specifies the address and type of data (overcharging, battery cell voltage, etc.).

As explained above, the main controller 5 collects individual voltage of the battery cells and performs cell balancing control upon start-up, and then sends a signal for sensing abnormality of each control IC chip and, if abnormality is sensed, sends a signal for identifying the abnormality detail.

In this embodiment, a multi-series battery control system comprises a plurality of unit battery cells (2) of which unit consists of multiple battery cells (2A-2D) connected in series; a plurality of control IC chips (3A-5A) comprising a control circuit for controlling the unit battery cell (2); a plurality of cell monitor IC chips (3B-5B) each monitoring the voltage of the unit battery cell (2); a plurality of control ICs (3) each consisting of the control IC chip (3A-5A) and the cell monitor IC chip (3B-5B); a main controller (5) that sends and receives signal to/from the control IC chips (3A-5A) via an insulation (4,8); means (process in 510) for sending an abnormality signal, which represents the existence or the absence of abnormality of the control IC chips or the battery cells, to the main controller (5) from the control IC chips (3A-5A), responding to the first signal (abnormality sensing command) outputted from the main controller (5) via the insulation (4,8); means (process in 540) for sending the abnormality contents signal of the control IC chip or the battery cells, to the main controller (5) from the control IC chips (3A-5A), responding to the second signal (condition sensing command) outputted from the main controller (5) via the insulation (4,8); and means (process in 410) for sending voltage signals of the battery cells, to the main controller (5) from the control IC chips (3A-5A), responding to a voltage sensing command outputted from the main controller (5) via the insulation (4,8).

The main controller 5 periodically senses the total voltage of the battery cells by the voltage sensing means and collects it through the VALL terminal of the main controller 5 via the insulation means. It also senses the total current through the battery cells by the current sensing means and collects it through the CUR terminal of the main controller 5. In addition, the main controller 5 periodically sums up each cell voltage and compares the total voltage so as to accomplish conformity diagnosis by checking if the differential voltage is within a specified range. Since whether this differential voltage is within a specified range or not is always checked, nothing more is needed to adjust the balancing but turning ON/OFF the balancing switches according to the voltage of each battery cell.

Figure 11:
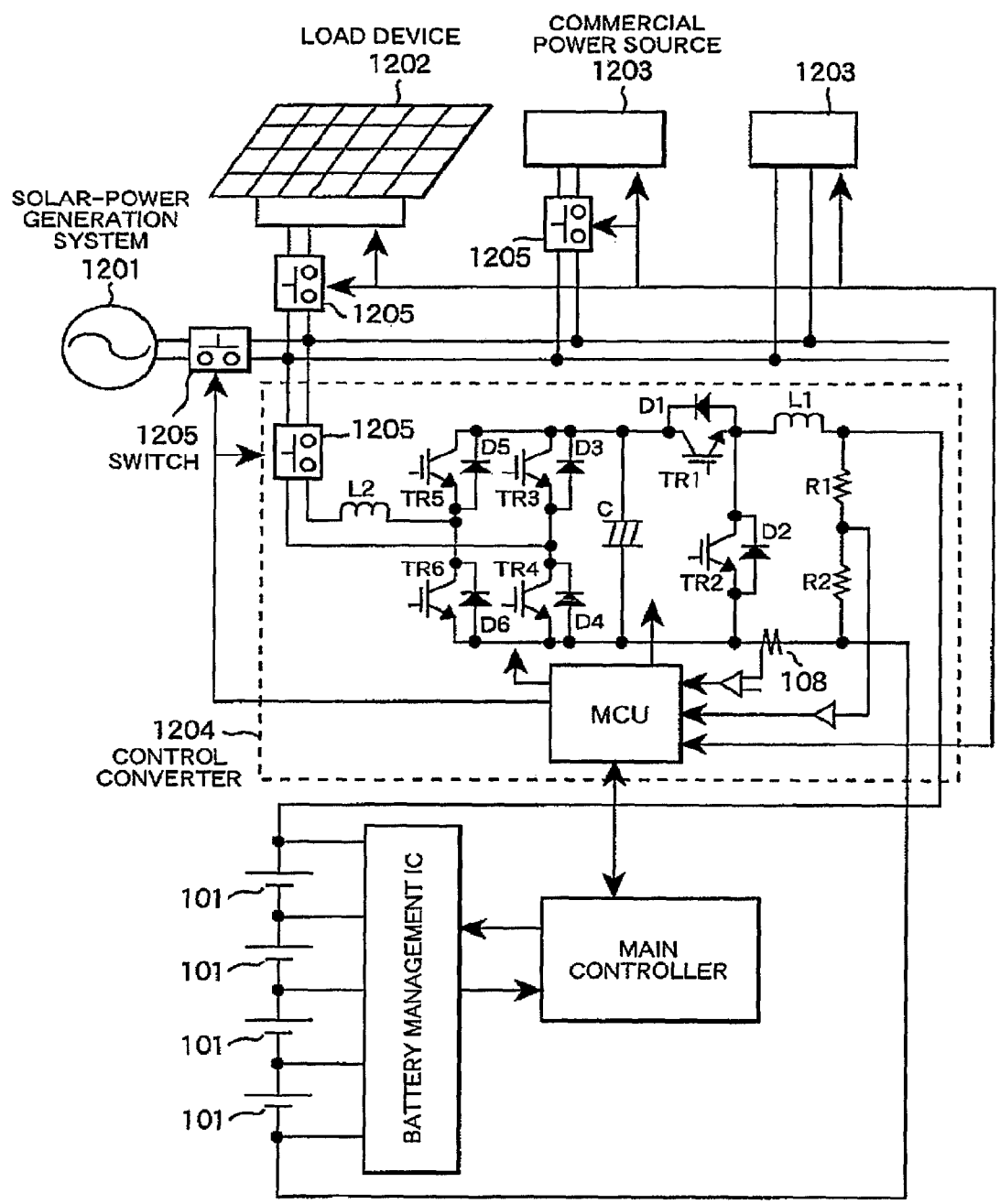
FIG. 11 is a diagram showing a case where the invention is employed in combination with a commercial power source.

FIG. 11 shows a case where this embodiment is employed in combination with a commercial power source.

In the figure, 1201 is a commercial power source, 1202 is a solar-power generation system, 1203 is a load device, 1204 is a control converter, and 1205 is a switch.

Multiple battery cells 101 are connected in series, a battery management IC is connected with each battery cell 101, and the output of the battery management IC is connected with the main controller 5 via an insulation coupler. In addition, the control converter 1204 is connected to both ends of the row of the battery cells 101, and the main controller 5 is connected with the MCU in the control converter 1204.

Furthermore, the solar-power generation system 1202, load device 1203 and control converter 1204 are connected with the common commercial power source 1201 each via a switch 1205. At the same time, the solar-power generation system 1202, load device 1203, control converter 1204, switch 1205 and main controller 5 are connected with each other in both directions.

The solar-power generation system 1202 is a system that converts the sunlight to DC current using solar cells and outputs AC current using an inverter.

The load device 1203 includes home electric appliances such as air-conditioner, refrigerator, microwave range, and lighting, and electric appliances such as motor, computer, and medical devices. The control converter 1204 is a charging/discharging device that converts AC current to DC current or DC current to AC current. This converter also functions as a controller for controlling the charging and discharging as well as for controlling the above solar-power generation system 1202 and load device 1203.

In the construction as above, if power needed for the load device 1203 cannot be fully supplied by the commercial power source 1201 and solar-power generation system 1202, power is supplied from the battery cell 101 via the control converter 1204. When the power supplied from the commercial power source 1201 and solar-power generation system 1202 becomes excessive, it is stored in the battery cell 101 via the control converter 1204.

If the terminal-to-terminal voltage of the battery cell 101 reaches a level requiring charging or discharging to be ceased in the course of the above operation, the main controller 5 sends a relevant signal to the control converter 1204 and the control converter 1204 controls charging and discharging accordingly.

With the above construction, it becomes possible to lower the contract demand and power demand of the commercial power source 1201 and generation rating of the solar-power generation system 1202, and hence equipment cost and running cost decrease.

In addition, if power is supplied from the battery cell 101 to the commercial power source 1201 when the power demand concentrates to a specific time zone and stored into a storage battery when the power demand is low, the concentration of power demand can be moderated and the power demand can be leveled Furthermore, since the control converter 1204 monitors the power demand of the load device 1203 and controls the load device 1203 accordingly, energy saving and effective utilization of power can be realized.

Figure 12:
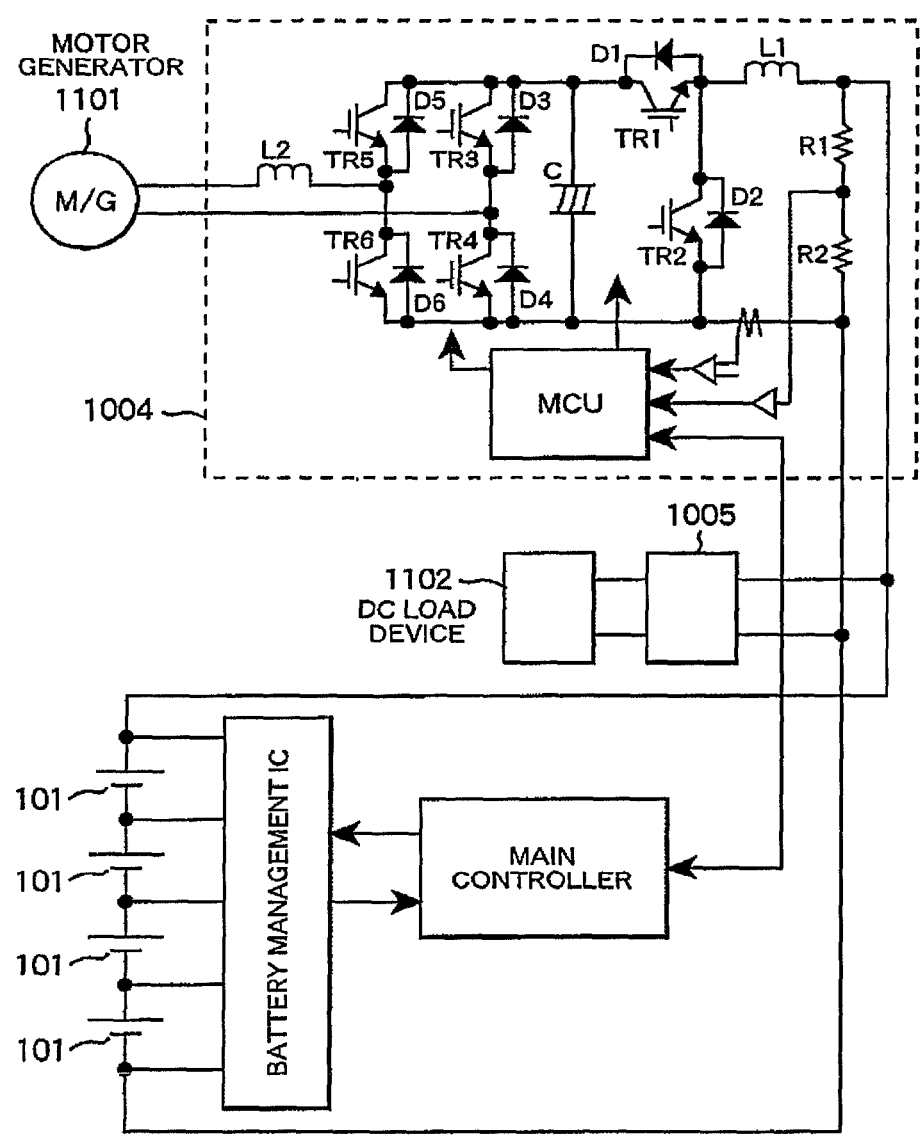
FIG. 12 is a diagram showing a case where the invention is applied to a motor generator.

FIG. 12 shows a case where the embodiment is applied to a motor generator.

If the figure, 1101 is a motor generator, 1004 is a control converter, 1005 is a voltage regulator, and 1102 is a DC load device (for example, power steering, electric brake, and suction/exhaust valve timing device).

Multiple battery cells 101 are connected in series, a battery management IC is connected with each battery cell 101, and the output of the battery management IC is connected with the main controller 5 via an insulation coupler. In addition, the main controller 5 is connected with the MCU in the control converter 1004.

The motor generator 1101 is a motor that converts the generated AC power to DC power and outputs.

With the above construction, while an automobile is driven by engine and is moving, power is generated by the motor generator 1101 that is driven by the automobile movement via a drive belt or directly driven by actuating an electromagnetic clutch. The power generated by the motor generator 1101 is supplied and charged into the battery cell 101 via the control converter 1004. Charging and discharging of the battery cell 101 is controlled by the motor generator 1101 through the battery management IC and via the main controller 5. In case of discharging, power is supplied through the battery management IC to the motor to drive the tires to rotate. The MCU in the control converter 1004 and the system are also connected with each other.

The main controller 5 is grounded with the ground (chassis ground) but both ends of the battery cells 2A, 2B, 2C, 2D of the unit battery cell 2 are lifted from the ground. The control converter 1004 is not grounded, either but lifted from the ground. In short, the power related circuit is lifted from the ground.

If the system is actually abnormal while the main controller 5 becomes out of control and mistakenly judges normal, the relay cannot be turned off because the main controller 5 is out of control. If this happens, a signal is outputted from an analog system so as to drive the relay drive circuit and turn OFF the relay.

With this embodiment, the number of components constituting the multi-series battery control system can be decreased.

In addition, with this embodiment, lower cost can be realized in constructing the multi-series battery control system.

Furthermore, with this embodiment, higher reliability of the multi-series battery control system can be realized.

Furthermore, with this embodiment, operability of the multi-series battery control system can be improved.

Furthermore, with this embodiment, the multi-series battery control system can be further generalized.

With this embodiment, higher-speed communication in the multi-series battery control system can also be realized.

In addition, with this embodiment, the multi-serial battery control system can be easily constructed and can be simplified.

According to the proper embodiments of the present invention, high reliability can be achieved.

What is claimed is:

1. A battery system, comprising:
a plurality of unit battery cells that are electrically connected in series and each include a plurality of battery cells that are electrically connected in series;
a plurality of integrated circuits that are provided to respectively correspond to the plurality of unit battery cells, each are electrically connected to terminals of the plurality of battery cells of a corresponding unit battery cell to monitor the plurality of battery cells of the corresponding unit battery cell, wherein:
each of the plurality of integrated circuits includes
a first signal input terminal to input a one bit signal that is in high level or low level,
a first signal output terminal to output a one bit signal that is in high level or low level,
a second signal input terminal to input a command signal,
a second signal output terminal to output a command signal,
a detection unit that detects whether or not the plurality of battery cells of the corresponding unit battery cell have overcharging or over-discharging, and
a communication circuit that generates the one bit signal to be outputted from the first signal output terminal based upon the one bit signal input at the first signal input terminal;
a first signal transmission line via which the one bit signal is transmitted in series through the plurality of integrated circuits is provided among the plurality of integrated circuits so that a signal is outputted from a first signal output terminal of a first integrated circuit based upon a signal inputted at a first signal input terminal of the first integrated circuit to be inputted at a first signal input terminal of a second integrated circuit;
a second signal transmission line via which the command signal is transmitted in series through the plurality of integrated circuits is provided among the plurality of integrated circuits so that a signal is outputted from a second signal output terminal of a first integrated circuit based upon a signal inputted at a second signal input terminal of the first integrated circuit to be inputted at a second signal input terminal of a second integrated circuit,
wherein the first signal input terminal comprises a fault-flag input terminal and and the first signal output terminal comprises a fault-flag output terminal configured to respectively receive and send an abnormality-indicating signal which has a single first level to indicate a normal condition and a single second level to indicate an abnormal condition so that the normal condition is indicated by the single first level without the need for additional signals or levels, and so that the abnormal condition is indicated by the single second level, without the need for additional signals or levels, and
wherein the battery system is configured such that the fault-flag output terminal sends the abnormality-indicating signal having the single second level when the fault-flag input terminal receives the abnormality-indicating signal having the single second level,
wherein the battery system includes a battery cell abnormality detection circuit to detect an abnormality in one of the battery cells, and
wherein the battery system is configured to send the abnormality-indicating signal having the single second level from the fault-flag output terminal when the battery cell abnormality detection circuit detects an abnormality in one of the battery cells.

2. A battery system according to claim 1, further comprising:
a controller that outputs a signal to the plurality of integrated circuits;

a first insulation unit that is provided between a first signal input terminal of a first integrated circuit, which receives a one bit signal outputted from the controller, and the controller;

a second insulation unit that is provided between a second signal input terminal of the first integrated circuit, which receives a command signal outputted from the controller, and the controller, wherein:

the first signal transmission line is electrically insulated by the first insulation unit, and transmits the one bit signal outputted from the controller to the first signal input terminal of the first integrated circuit via the first insulation unit; and the second signal transmission line is electrically insulated by the second insulation unit, and transmits the command signal outputted from the controller to the second signal input terminal of the first integrated circuit via the second insulation unit.

3. A battery system according to claim 2, wherein:

the controller tests a state of the first signal transmission line by outputting the one bit signal for testing the first signal transmission line to the first signal input terminal of the first integrated circuit via the first insulation unit, and receiving back the one bit signal for testing the first signal transmission line via the first insulation unit.

4. A battery system, comprising:

a plurality of unit battery cells that are electrically connected in series and each include a plurality of battery cells that are electrically connected in series;

a plurality of battery-cell-control integrated circuits that are provided to respectively correspond to the plurality of unit battery cells, and each are used to detect terminal voltages of a plurality of battery cells of a corresponding unit battery cell;

a plurality of battery-cell-monitor integrated circuits that are respectively paired with the plurality of battery-cell-control integrated circuits, and each are connected with a plurality of battery cells that are connected with a corresponding paired battery-cell-control integrated circuit to be used to monitor the plurality of battery cells connected with the corresponding paired battery-cell-control integrated circuit, wherein:

each of the plurality of battery-cell-monitor integrated circuits includes a first signal input terminal to input a one bit signal that is in high level or low level, a first signal output terminal to output a one bit signal that is in high level or low level, a second signal input terminal to input a command signal, a second signal output terminal to output a command signal, a detection unit that detects whether or not the plurality of battery cells of the corresponding unit battery cell have overcharging or over-discharging, and a communication circuit that generates the one bit signal to be outputted from the first signal output terminal based upon the one bit signal input at the first signal input terminal;

a first signal transmission line via which the one bit signal is transmitted in series through the plurality of battery-cell-monitor integrated circuits is provided among the plurality of battery-cell-monitor integrated circuits so that a signal is outputted from a first signal output terminal of a first battery-cell-monitor integrated circuit based upon a signal inputted at a first signal input terminal of the first battery-cell-monitor integrated circuit to be inputted at a first signal input terminal of a second battery-cell-monitor integrated circuit;

a second signal transmission line via which the command signal is transmitted in series through the plurality of battery-cell-monitor integrated circuits is provided among the plurality of battery-cell-monitor integrated circuits so that a signal is outputted from a second signal output terminal of a first battery-cell-monitor integrated circuit based upon a signal inputted at a second signal input terminal of the first battery-cell-monitor integrated circuit to be inputted at a second signal input terminal of a second battery-cell-monitor integrated circuit, wherein the first signal input terminal comprises a fault-flag input terminal and the first signal output terminal comprises a fault-flag output terminal configured to respectively receive and send an abnormality-indicating signal which has a single first level to indicate a normal condition and a single second level to indicate an abnormal condition so that the normal condition is indicated by the single first level without the need for additional signals or levels, and so that the abnormal condition is indicated by the single second level, without the need for additional signals or levels, and wherein the battery system is configured such that the fault-flag output terminal sends the abnormality-indicating signal having the single second level when the fault-flag input terminal receives the abnormality-indicating signal having the single second level, wherein the battery system includes a battery cell abnormality detection circuit to detect an abnormality in one of the battery cells, and wherein the battery system is configured to send the abnormality-indicatinq signal having the single second level from the fault-flag output terminal when the battery cell abnormality detection circuit detects an abnormality in one of the battery cells.

5. A battery system according to claim 4, further comprising:

a controller that outputs a signal to the plurality of battery-cell-monitor integrated circuits;

a first insulation unit that is provided between a first signal input terminal of a first battery-cell-monitor integrated circuit, which receives a one bit signal outputted from the controller, and the controller;

a second insulation unit that is provided between a second signal input terminal of the first battery-cell-monitor integrated circuit, which receives a command signal outputted from the controller, and the controller, wherein:

the first signal transmission line is electrically insulated by the first insulation unit, and transmits the one bit signal outputted from the controller to the first signal input terminal of the first battery-cell-monitor integrated circuit via the first insulation unit; and the second signal transmission line is electrically insulated by the second insulation unit, and transmits the command signal outputted from the controller to the second signal input terminal of the first battery-cell-monitor integrated circuit via the second insulation unit.

* * * * *